US012712493B2

(12) United States Patent
Lu et al.

(10) Patent No.: US 12,712,493 B2
(45) Date of Patent: Aug. 18, 2026

(54) POWER SUPPLY CIRCUIT, POWER SUPPLY METHOD, AUDIO POWER AMPLIFIER AND INTEGRATED CIRCUIT

(71) Applicant: WUHAN JUXIN MICRO-ELECTRONICS CO., LTD., Wuhan (CN)

(72) Inventors: Jie Lu, Wuhan (CN); Yi Ke, Wuhan (CN); Deheng Liu, Wuhan (CN); Kezheng Ma, Wuhan (CN)

( * ) Notice: Subject to any disclaimer, the term of this patent is extended or adjusted under 35 U.S.C. 154(b) by 611 days.

(21) Appl. No.: 18/266,256

(22) PCT Filed: Sep. 7, 2021

(86) PCT No.: PCT/CN2021/116871

§ 371 (c)(1), (2) Date: Jun. 8, 2023

(87) PCT Pub. No.: WO2022/095580

PCT Pub. Date: May 12, 2022

(65) Prior Publication Data

US 2024/0106394 A1 Mar. 28, 2024

(30) Foreign Application Priority Data

Nov. 9, 2020 (CN) ......................... 202011241839.6

(51) Int. Cl.

| | |
|---|---|
| ***H03F 1/02*** | (2006.01) |
| ***H03F 3/187*** | (2006.01) |
| ***H03F 3/217*** | (2006.01) |

(52) U.S. Cl.

CPC ........... *H03F 1/0227* (2013.01); *H03F 3/187* (2013.01); *H03F 3/217* (2013.01); *H03F 2200/03* (2013.01)

(58) Field of Classification Search

CPC ........ H03F 1/0227; H03F 3/187; H03F 3/217; H03F 2200/03; H03F 3/45475;

(Continued)

(56) References Cited

U.S. PATENT DOCUMENTS

| | | | |
|---|---|---|---|
| 6,985,039 | B2 | 1/2006 | Bar-David et al. |
| 2004/0251968 | A1 | 12/2004 | Bar-David et al. |

(Continued)

FOREIGN PATENT DOCUMENTS

| | | | |
|---|---|---|---|
| CN | 1722611 | A | 1/2006 |
| CN | 106208973 | A | 12/2016 |

(Continued)

OTHER PUBLICATIONS

International Search Report of PCT/CN2021/116871 filed Sep. 7, 2021.

(Continued)

*Primary Examiner* — Andrea Lindgren Baltzell
*Assistant Examiner* — Khiem D Nguyen
(74) *Attorney, Agent, or Firm* — Chang & Hale LLP

(57) ABSTRACT

Disclosed are a power supply circuit, power supply method, audio power amplifier and integrated circuit. The power supply circuit applied to an audio power amplifier may include: a measurement sub-circuit used for measuring a voltage of an audio signal input to the audio power amplifier, which corresponds to output power of the audio power amplifier; a control sub-circuit used for determining a target reference voltage range according to a voltage range of the audio signal within a predetermined time period, which is selected from a plurality of predetermined reference voltage ranges, wherein the voltage range of audio signal within the predetermined time period is included in the target reference voltage range; and a power supply sub-circuit used for generating, based on the target reference voltage range, a (Continued)

power supply voltage that matches the output power of the audio power amplifier, so as to supply power to the audio power amplifier.

20 Claims, 7 Drawing Sheets

(58) Field of Classification Search
CPC ........... H03F 2200/511; H03F 2200/78; H03F 3/2173; H03F 1/0211; H03F 1/30; H02M 3/156
USPC .......................................................... 330/297
See application file for complete search history.

(56) References Cited

U.S. PATENT DOCUMENTS

2006/0015199 A1 1/2006 Ebi et al.
2006/0061416 A1* 3/2006 Kusunoki ............. H03F 1/0205 330/136
2011/0254625 A1* 10/2011 Kohut .................. H03F 1/0222 330/251
2013/0029620 A1 1/2013 Liu et al.
2020/0350865 A1 11/2020 Khlat

FOREIGN PATENT DOCUMENTS

CN 106535052 A 3/2017
CN 110504925 A 11/2019
CN 111836164 A 10/2020
CN 112543000 A 3/2021

OTHER PUBLICATIONS

Written Opinion of the International Searching Authority of PCT/CN2021/116871 filed Sep. 7, 2021.
Search Report of Chinese Application No. 202011241839.6 filed Nov. 9, 2020.

* cited by examiner $V_O$ $V_{O\_Power\ Amplifier}$

1201

Detect a first voltage of an audio signal provided to the audio power amplifier

1202

Determine a target reference voltage range based on a voltage range of the audio signal within a predetermined time period

1203

Generate a power supply voltage that matches the output power of the audio power amplifier based on the target reference voltage range

POWER SUPPLY CIRCUIT, POWER SUPPLY METHOD, AUDIO POWER AMPLIFIER AND INTEGRATED CIRCUIT

CROSS-REFERENCE

The present application is a national phase entry under 35 U.S.C. 371 of International Patent Application No. PCT/CN2021/116871 filed on Sep. 7, 2021, which claims priority from Chinese Patent Application No. 202011241839.6 filed on Nov. 9, 2020, all of which are incorporated herein by reference in their entirety.

TECHNICAL FIELD OF THE DISCLOSURE

The present disclosure relates to the field of power amplifiers, in particular to a power supply circuit and method, audio power amplifier, and integrated circuit.

BACKGROUND

In the application process of audio power amplifiers, their output power is limited by the output voltages of their own power supply. Generally, a boost type direct current to direct current (DC-DC) circuit or a charge-pump circuit is used as the power supply circuit of the audio power amplifier. The power supply circuit can increase an output signal amplitude of the audio power amplifier by increasing the power supply voltage thereof, thereby increasing the output power.

However, in related technologies, the power supply circuit of the audio power amplifier still needs to be optimized.

SUMMARY

In order to solve the technical problems, embodiments of the present disclosure provide a power supply circuit, a power supply method, an audio power amplifier, and an integrated circuit.

According to an embodiment, a power supply circuit for an audio power amplifier is provided, comprising a detection sub-circuit for detecting a voltage of an audio signal input to the audio power amplifier, wherein the voltage of the audio signal corresponds to output power of the audio power amplifier; a control sub-circuit for determining a target reference voltage range based on a voltage range of the audio signal within a predetermined time period, wherein the target reference voltage range is selected from a plurality of predetermined reference voltage ranges, and the voltage range of the audio signal within the predetermined time period is included within the target reference voltage range; and a power supply sub-circuit for generating a power supply voltage that matches the output power of the audio power amplifier based on the target reference voltage range so as to supply power to the audio power amplifier.

In some embodiments, the plurality of predetermined reference voltage ranges comprise a first reference voltage range and a second reference voltage range, wherein a lower limit value of the first reference voltage range is larger than a lower limit value of the second reference voltage range, and an upper limit value of the first reference voltage range is less than an upper limit value of the second reference voltage range.

In some embodiments, the control sub-circuit comprises: a first comparison circuit for selecting a reference voltage range from the plurality of predetermined reference voltage ranges and comparing it with the voltage of the audio signal detected by the detection sub-circuit; a counting circuit for counting when the first comparison circuit determines that the voltage of the audio signal exceeds the reference voltage range selected by the first comparison circuit. A count value of the counting circuit is fed back to the first comparison circuit, and the first comparison circuit selects a next predetermined reference voltage range based on the count value of the counting circuit until the voltage of the audio signal falls within the reference voltage range selected by the first comparison circuit.

In some embodiments, the first comparison circuit includes: a first data selector for selecting and outputting an upper limit value of one of the plurality of predetermined reference voltage ranges; a first comparator, wherein a positive phase input terminal thereof receives the voltage of the audio signal detected by the detection sub-circuit, and a negative phase input terminal thereof receives an output of the first data selector; a second data selector for selecting and outputting a lower limit value of one of the plurality of predetermined reference voltage ranges; and a second comparator, wherein the positive phase input terminal thereof receives an output of the second data selector, and a negative phase input terminal thereof receives the voltage of the audio signal detected by the detection sub-circuit.

In some embodiments, the counting circuit comprises: a first logic OR circuit for performing a logic or operation on the output of the first comparator and the output of the second comparator; and a counter for counting an output signal of the first logic OR circuit. A count value of the counter is fed back to the first data selector and the second data selector, and the first data selector and the second data selector both select a corresponding reference voltage range from the plurality of predetermined reference voltage ranges based on the count value.

In some embodiments, the control sub-circuit further comprises a second comparison circuit for comparing the voltage of the audio signal detected by the detection sub-circuit with a reference voltage; an edge detection circuit for determining a moment at which the audio signal intersects with the reference voltage by detecting an output of the second comparison circuit, thereby determining the predetermined time period; and a trigger circuit for updating a count value stored in the trigger circuit with a current count value of the counting circuit, and outputting the updated count value, when the edge detection circuit determines that the audio signal intersects with the reference voltage in the edge detection circuit, and the current count value of the counting circuit is different from the count value stored in the trigger circuit, wherein the count value output by the trigger circuit indicates the target reference voltage range.

In some embodiments, the reference voltage is a common mode voltage of the audio signal.

In some embodiments, the edge detection circuit determines the moment at which the audio signal upward/downward passes through the reference voltage by detecting a rising and/or falling edge(s) of an output signal of the second comparison circuit.

In some embodiments, the edge detection circuit also outputs a reset signal to the counting circuit to reset the count value of the counting circuit when determining that the audio signal interacts with the reference voltage.

In some embodiments, the control sub circuit further comprises a third comparison circuit for comparing the current count value of the counting circuit with the count value stored in the trigger circuit to determine whether a reference voltage range corresponding to the current count value of the counting circuit increases or decreases relative to a reference voltage range corresponding to the count value stored in the trigger circuit. When the third comparison circuit determines that the reference voltage range corresponding to the current count value of the counting circuit increases relative to the reference voltage range corresponding to the count value stored in the trigger circuit, and the edge detection circuit determines that the audio signal intersects with the reference voltage, the trigger circuit updates the count value stored in the trigger circuit with the current count value of the counting circuit, and output the updated count value.

In some embodiments, the control sub-circuit further comprises a delay circuit for starting to time for a predetermined duration when the third comparison circuit determines that the reference voltage range corresponding to the current count value of the counting circuit decreases relative to the reference voltage range corresponding to the count value stored in the trigger circuit. When the third comparison circuit still determines that the reference voltage range corresponding to the current count value of the counting circuit decreases relative to the reference voltage range corresponding to the count value stored in the trigger circuit after the predetermined duration, and the edge detection circuit determines that the audio signal intersects with the reference voltage, the trigger circuit updates the count value stored in the trigger circuit with the current count value of the counting circuit, and outputs the updated count value.

In some embodiments, the power supply sub-circuit adjusts a resistance value of a feedback resistor in the power supply sub-circuit based on a signal received from the control sub-circuit indicating the target reference voltage range, to generate a voltage that matches the output power of the audio power amplifier.

In some embodiments, the power supply sub-circuit selects a reference voltage used in the power supply sub-circuit based on a signal received from the control sub-circuit indicating the target reference voltage range, to generate a voltage that matches the output power of the audio power amplifier.

According to another embodiment, a method for supplying power to an audio power amplifier is provided. The method comprises: detecting a voltage of an audio signal input to the audio power amplifier, wherein the voltage of the audio signal corresponds to output power of the audio power amplifier; determining a target reference voltage range based on a voltage range of the audio signal within a predetermined time period, wherein the target reference voltage range is selected from a plurality of predetermined reference voltage ranges, and the voltage range of the audio signal within the predetermined time period is included within the target reference voltage range; and generating a power supply voltage that matches the output power of the audio power amplifier based on the target reference voltage range to supply power to the audio power amplifier.

In some embodiments, determining the target reference voltage range comprises: selecting a reference voltage range from the plurality of predetermined reference voltage ranges and comparing it with the voltage of the audio signal by a first comparison circuit; and counting by a counting circuit when the voltage of the audio signal exceeds the selected reference voltage range. The first comparison circuit selects a next predetermined reference voltage range based on the count value of the counting circuit, until the voltage of the audio signal falls within the selected reference voltage range.

In some embodiments, determining the target reference voltage range further comprises: comparing the voltage of the audio signal with a reference voltage by a second comparison circuit; determining a moment at which the audio signal intersects with the reference voltage by detecting an output of the second comparison circuit by an edge detection circuit, thereby determining the predetermined time period; and when the edge detection circuit determines that the audio signal intersects with the reference voltage, and a current count value of the counting circuit is different from a count value stored in a trigger circuit, updating the count value stored in the trigger circuit with the current count value of the counting circuit, and outputting the updated count value by the trigger circuit, wherein the count value output by the trigger circuit indicates the target reference voltage range.

In some embodiments, the method further comprises providing a reset signal to the counting circuit to reset the count value of the counting circuit when the edge detection circuit determines that the audio signal intersects with the reference voltage.

In some embodiments, determining the target reference voltage range further comprises: comparing the current count value of the counting circuit with the count value stored in the trigger circuit by a third comparison circuit to determine whether a reference voltage range corresponding to the current count value of the counting circuit increases or decreases relative to a reference voltage range corresponding to the count value stored in the trigger circuit; and when the third comparison circuit determines that the reference voltage range corresponding to the current count value of the counting circuit increases relative to the reference voltage range corresponding to the count value stored in the trigger circuit, and the edge detection circuit determines that the audio signal intersects with the reference voltage, the trigger circuit updates the count value stored in the trigger circuit with the current count value of the counting circuit, and output the updated count value.

In some embodiments, determining the target reference voltage range further comprises: starting to time a predetermined duration by a delay circuit when the third comparison circuit determines that the reference voltage range corresponding to the current count value of the counting circuit decreases relative to the reference voltage range corresponding to the count value stored in the trigger circuit; and when the third comparison circuit still determines that the reference voltage range corresponding to the current count value of the counting circuit decreases relative to the reference voltage range corresponding to the count value stored in the trigger circuit after the predetermined duration, and the edge detection circuit determines that the audio signal intersects with the reference voltage, updating the count value stored in the trigger circuit with the current count value of the count circuit, and outputting the updated count value by the trigger circuit.

In some embodiments, generating a power supply voltage that matches the output power of the audio power amplifier comprises adjusting a resistance value of a feedback resistor used in the power supply sub-circuit or selecting a reference voltage used in the power supply sub-circuit according to the target reference voltage range, to generate a voltage that matches the output power of the audio power amplifier.

According to another embodiment, an audio power amplifier is provided, comprising: an audio power amplification circuit; and a power supply circuit for supplying power to the audio power amplification circuit.

According to another embodiment, an integrated circuit is provided, comprising the audio power amplifier mentioned above.

According to another embodiment, an electronic device is provided, comprising: the audio power amplifier that receives an audio signal and amplifies the audio signal; and a speaker for playing the audio signal.

In the embodiments of the present disclosure, the power supply circuit detects the output power magnitude of the audio power amplifier and generates a power supply voltage that matches the output power magnitude of the audio power amplifier, achieving an adaptive adjustment of the output voltage of the power supply circuit. Therefore, in scenarios where the output power of the audio power amplifier needs to be reduced, the power supply circuit can reduce the output power supply voltage, reducing the current flowing through the power transistor in the power supply circuit and the power transistor in the audio power amplifier, thereby reducing the conduction loss caused to the power transistor in the power supply circuit and the power transistor in the audio power amplifier, improving the power supply efficiency of the power supply circuit, and improving the working efficiency of the audio power amplifier.

DETAILED DESCRIPTION

The following will provide a further detailed explanation of the technical solution of the present disclosure in conjunction with the accompanying drawings and embodiments.

In related technologies, the output voltage (i.e. supply voltage) of the power supply circuit of an audio power amplifier is usually a constant voltage. In order to ensure that the output power of the audio power amplifier meets the requirements of some application scenarios, the output voltage of the power supply circuit is usually a larger voltage. However, for some application scenarios that require audio power amplifiers to output smaller power, if the power supply circuit still supplies the audio power amplifier with a larger voltage, a larger current flowing through a power transistor in the power supply circuit and a larger conduction loss on the power transistor will occur; in addition, if the output power of the audio power amplifier is relatively small, while the power supply voltage that supplies the audio power amplifier is relatively high, a greater driving loss (i.e., the current flowing through the power transistor in the audio power amplifier) will be large, thereby reducing the working efficiency of the audio power amplifier.

Based on this, in various embodiments of the present disclosure, the power supply circuit detects an output power magnitude of the audio power amplifier and generates a power supply voltage that matches the output power magnitude of the audio power amplifier, achieving an adaptive output voltage of the power supply circuit. As such, in scenarios where the output power of the audio power amplifier needs to be reduced, the power supply circuit can reduce the output power supply voltage, which reduces the current flowing through the power transistor in the power supply circuit and the power transistor in the audio power amplifier, thereby reducing the conduction loss caused to the power transistor in the power supply circuit and the power transistor in the audio power amplifier, improving the power supply efficiency of the power supply circuit, and improving the working efficiency of the audio power amplifier.

Figures 1, 2:
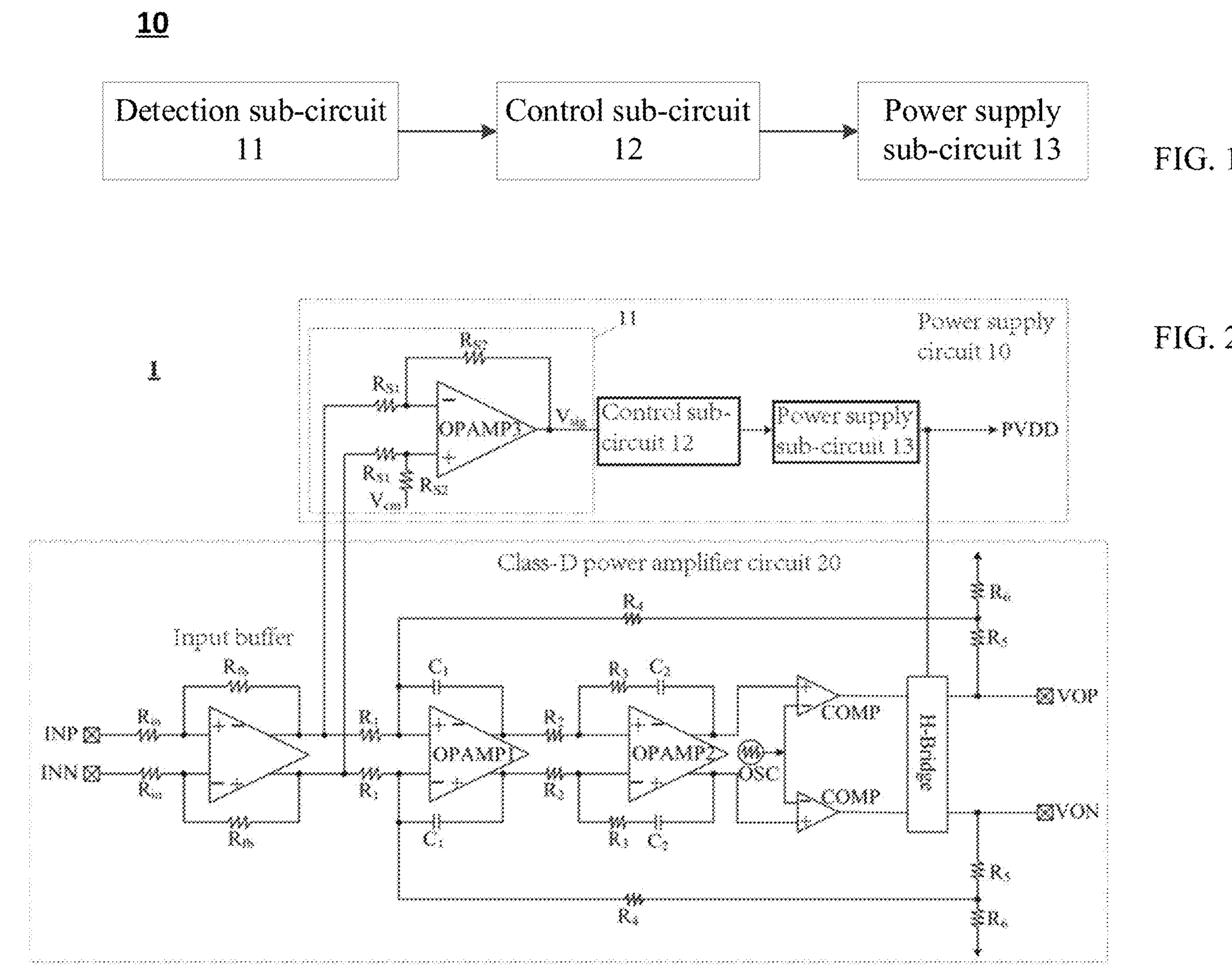
FIG. 1 is a structural block diagram of a power supply circuit according to an embodiment of the present disclosure.
FIG. 2 is a circuit diagram of an audio power amplifier according to an embodiment of the present disclosure.

An embodiment of the present disclosure provides a power supply circuit applied to an audio power amplifier 1 (see FIG. 2). As shown in FIG. 1, a power supply circuit 10 comprises a detection sub-circuit 11, a control sub-circuit 12, and a power supply sub-circuit 13.

The detection sub-circuit 11 is used to detect a voltage of an audio signal input to the audio power amplifier 1, which is hereinafter referred to as a first voltage. Based on the first voltage, the output power magnitude of the audio power amplifier 1 can be determined.

The control sub-circuit 12 is used to determine a target reference voltage range based on a voltage range of the audio signal within a predetermined period of time. The target reference voltage range is selected from a plurality of predetermined reference voltage ranges and is included in the voltage range of the audio signal within the predetermined period of time.

The power supply sub-circuit 13 is used to generate a power supply voltage that matches the output power of audio power amplifier 1 based on the target reference voltage range, to supply power to the audio power amplifier 1.

Here, the power supply sub-circuit 13 generating the power supply voltage that matches the output power of audio power amplifier 1 refers to: when the output power of the audio power amplifier 1 is small, the voltage generated by the power supply sub-circuit 13 is small; when the output power of the audio power amplifier 1 is high, the voltage generated by power supply sub-circuit 13 is high. Namely, the voltage generated by the power supply sub-circuit 13 increases as the output power of audio power amplifier 1 increases, and decreases as the output power of the audio power amplifier 1 decreases. In this way, an adaptive adjustment of the output voltage of the power supply circuit 10 has been achieved, which can improve the power supply efficiency of the power supply circuit 10 and improve the working efficiency of the audio power amplifier 1.

In some embodiments, the audio power amplifier 1 may be a digital audio power amplifier or an analog audio power amplifier. The power supply sub-circuit 13 may be a boost type DC-DC circuit or a charge-pump circuit.

In some embodiments, the first voltage of the audio signal input to the audio power amplifier 1 can be detected in an appropriate manner. FIG. 2 shows an embodiment of an audio power amplifier 1 that is a class-D audio power amplifier circuit comprising a class-D audio power amplifier circuit 20, wherein the power supply circuit 10 supplies power to the class-D audio power amplifier circuit 20. Due to the dual input and dual output structure of the class-D audio power amplifier 1, in order to detect the first voltage, it is necessary to convert the dual voltage signal input to audio power amplifier 1 into a single voltage signal. Therefore, as shown in FIG. 2, the detection sub-circuit 11 can comprise an operational amplifier OPAMP3 and a plurality of resistors such as $R_{S1}$ and $R_{S2}$.

For the audio power amplifier 1 shown in FIG. 2, the gain of the voltage from input to output can be calculated by the following formula:

$$A_{Class\_D} = \left(-\frac{R_{fb}}{R_{in}}\right) * \left[-\frac{R_4}{R_1} * R_5 * \left(\frac{1}{R_4} + \frac{1}{R_5} + \frac{1}{R_6}\right)\right], \tag{1}$$

where $A_{Class\_D}$ represents the gain from input voltage to output voltage of the audio power amplifier 1, and $R_{fb}$, $R_{in}$, $R_1$, $R_4$, $R_5$, and $R_6$ represent the resistance in each of the two channels included in the audio power amplifier, respectively.

For the detection sub-circuit 11 shown in FIG. 2, the gain of the voltage from input to output can be calculated by the following formula:

$$A_{sig} = \left(-\frac{R_{fb}}{R_{in}}\right) * \left(-\frac{R_{S2}}{R_{S1}}\right), \tag{2}$$

where $A_{sig}$ represents the gain from the input voltage to the output voltage of the detection sub-circuit 11, $R_{fb}$ represents the resistance of the input buffer of each of the two channels included in the audio power amplifier 1, and $R_{S1}$ and $R_{S2}$ respectively represent the resistance of each input channel in the two input channels included in the detection sub-circuit 11.

The relationship between the output voltage of the audio power amplifier 1 shown in FIG. 2 and the output voltage of the detection sub-circuit 11 shown in FIG. 2 can be expressed by the following formula:

$$\frac{V_{o\_Class\_D}}{V_{sig}} = \frac{A_{Class\_D}}{A_{sig}}, \tag{3}$$

where $V_{o\_Class\_D}$ represents the output voltage of the audio power amplifier 1, and Vsig represents the output voltage of the detection sub-circuit 11. Here, Vsig is the first voltage detected by the detection sub-circuit 11.

Using formula (3) and the principle that the power equals the square of the voltage divided by the resistance, the following formula can be obtained:

$$\frac{V_{o\_Class\_D}}{V_{o\_sig}} = \left(\frac{A_{Class\_D}}{A_{sig}}\right)^2, \tag{4}$$

where $P_{o\_Class\_D}$ represents the output power of the audio power amplifier 1, and $P_{o\_Sig}$ represents the output power of the detection sub-circuit 11.

By using formulas (3) and (4), the following formula can be obtained:

$$P_{o\_sig} = \left(\frac{A_{sig}}{A_{Class\_D}}\right)^2 * P_{o\_Class\_D} = \left(\frac{V_{sig}}{V_{o\_Class\_D}}\right)^2 * P_{o\_Class\_D} \tag{5}$$

It can be seen that after detecting the first voltage Vsig, the output power $P_{o\_Class\_D}$ audio power amplifier 1 can be determined based on formula (5). That is to say, the output power magnitude of the audio power amplifier 1 can be detected by detecting the first voltage.

Figure 3:
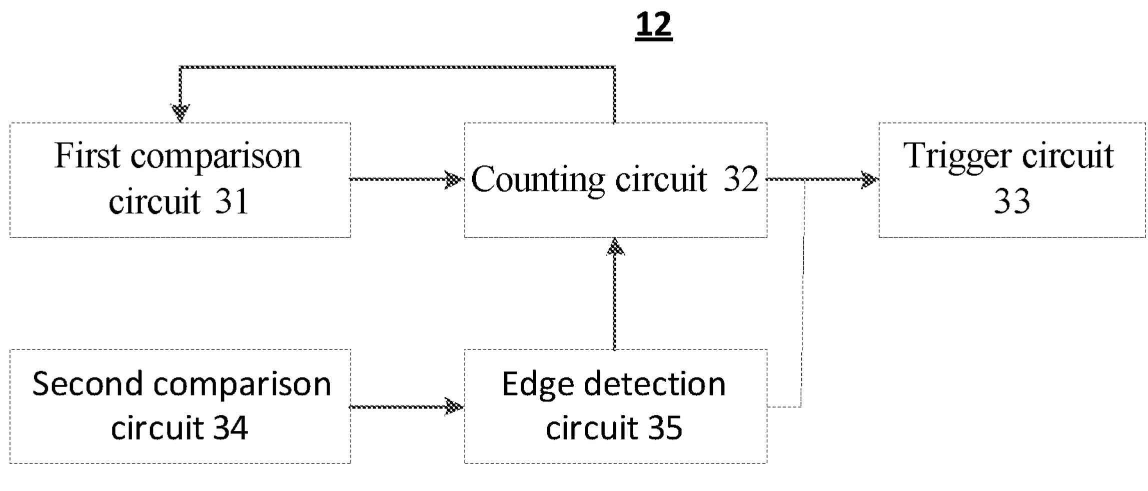
FIG. 3 is a block diagram of a control sub-circuit according to an embodiment of the present disclosure.

In an embodiment, as shown in FIG. 3, the control sub-circuit 12 may comprise a first comparison circuit 31 and a counting circuit 32. The first comparison circuit 31 can select a reference voltage range from a plurality of predetermined reference voltage ranges and compare it with the first voltage of the audio signal detected by the detection sub-circuit 11. The counting circuit 32 can count when the first comparison circuit 31 determines that the first voltage of the audio signal exceeds the reference voltage range selected by the first comparison circuit 31. The count value of the counting circuit 32 can be fed back to the first comparison circuit 31, and the first comparison circuit 31 can select a next predetermined reference voltage range based on the count value of the counting circuit 32 until the first voltage of the audio signal falls within the reference voltage range selected by the first comparison circuit 31.

In the embodiment shown in FIG. 3, the control sub-circuit 12 may further comprise a second comparison circuit 34, an edge detection circuit 35, and a trigger circuit 33. The second comparison circuit 34 can compare the first voltage of the audio signal detected by the detection sub-circuit 11 with a reference voltage, such as a common mode voltage Vcm of the audio signal. By detecting the output of the second comparison circuit 34, the edge detection circuit 35 can determine that the audio signal interacts with the reference voltage, that is, a moment when the first voltage of the audio signal is equal to the reference voltage, thereby determining the predetermined time period. When the edge detection circuit 35 determines that the audio signal intersects with the reference voltage, and a current count value of the counting circuit 32 is different from a count value stored in the trigger circuit 33, the trigger circuit 33 updates the count value stored in the trigger circuit 33 with the current count value of the counting circuit 32, and outputs the updated count value. The count value output by the trigger circuit 33 indicates the target reference voltage range determined by the control sub-circuit 12.

Here, the detection sub-circuit 11 detects the first voltage of the audio signal and then outputs the first voltage to the control sub-circuit 12; the control sub-circuit 12 achieves time-domain segmented encoding of the voltage range of the audio signal (later also known as the first signal) input to the audio power amplifier 1 by determining a target reference voltage range corresponding to the range of the first voltage within a predetermined time period among the X predetermined reference voltage ranges, where the target reference voltage range is represented by a target code, i.e., encoding the range of voltage amplitude of the first signal within a predetermined time period; different codes correspond to different ranges of voltage amplitudes of the first signal, and thus correspond to different output power ranges of the audio power amplifier 1, namely accomplishing in encoding different ranges of output power of the audio power amplifier 1. In this way, the control sub-circuit 12 can convert the voltage amplitude of the first signal from an analog quantity to a digital quantity (i.e., the code), and then correlate the voltage amplitude of the first signal with the output power of the audio power amplifier 1 through the digital quantity, thereby achieving an adaptive adjustment of the output voltage of the power supply circuit 10.

Figure 6:
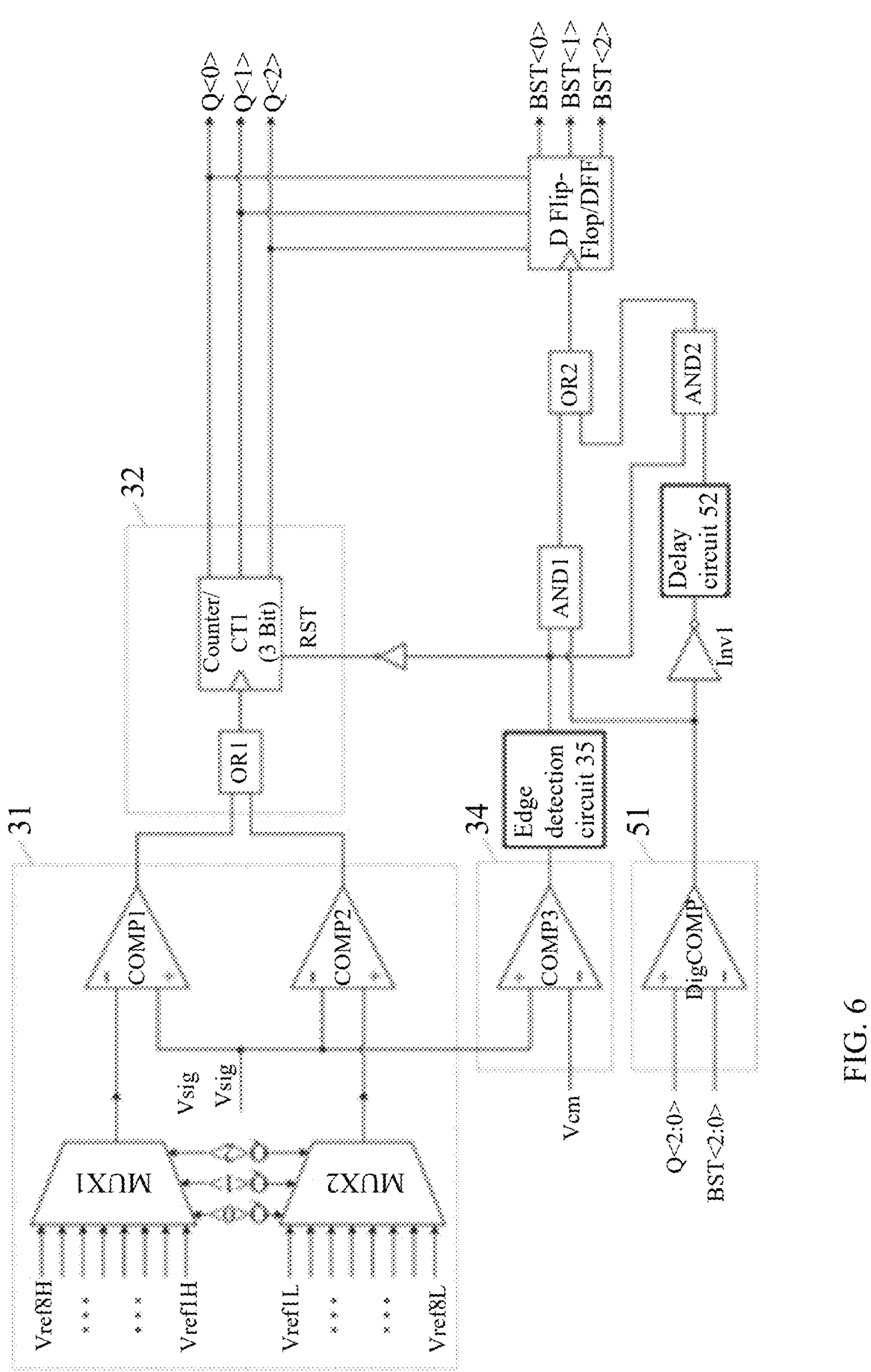
FIG. 6 is a circuit diagram of a control sub-circuit according to an embodiment of the present disclosure.

In some embodiments, as shown in FIG. 6, the first comparison circuit 31 may comprise a plurality of data selectors (Multiplexer) and configure the plurality of selectors to accomplish in predetermining X reference voltage ranges in the first comparison circuit 31 itself, where each reference voltage range in the X reference voltage ranges corresponds to an code. Specifically, the first comparison circuit 31 may comprise a first data selector MUX1 and a second data selector MUX2. Both the first data selector MUX1 and the second data selector MUX2 are X-path data selectors, where the value of X may be 4, 6, 8, 16, etc. The first data selector MUX1 is used to output an upper limit voltage of one of the X reference voltage ranges, and the second data selector MUX2 is used to output a lower limit voltage of one of the X reference voltage ranges. The code corresponding to each reference voltage range in the X reference voltage ranges can be represented by the channel corresponding to the upper limit voltage and lower limit voltage of the reference voltage range. In one embodiment, the control sub-circuit 12 can be a digital circuit, and the code of the reference voltage range can be binary code, with the encoded bits equal to $\log_2 X$. For example, when the value of X is 8, the code is a 3-bit binary code. The 0-7th channels of the first data selector MUX1 respectively correspond to the reference voltage Vref1H-Vref8H, and Vref1H<Vref2H<Vref3H<Vref4H<Vref5H<Vref6H<Vref7H<Vref8H.

The 0-7th channels of the second data selector MUX2 respectively correspond to the reference voltage Vref1L-Vref8L, and Vref1L>Vref2L>Vref3L>Vref4L>Vref5L>Vref6L>Vref7L>Vref8L.

The X reference voltage ranges can be represented as Vref1 (Vref1L, Vref1H), Vref2 (Vref2L, Vref2H), Vref3 (Vref3L, Vref3H), Vref4 (Vref4L, Vref4H), Vref5 (Vref5L, Vref5H), Vref6 (Vref6L, Vref6H), Vref7 (Vref7L, Vref7H), and Vref8 (Vref8L, Vref8H), respectively, and Vref8 contains Vref7, Vref7 containing Vref6, Vref8H Ref6 containing Vref5, Vref5 containing Vref4, Vref4 containing Vref3, Vref3 containing Vref2, and Vref2 containing Vref1. The reference voltage range Vref1 (Vref1L, Vref1H) corresponds to code 000 (representing the 0th channel); the reference voltage range Vref2 (Vref2L, Vref2H) corresponds to code 001 (representing the 1st channel); and the reference voltage range Vref8 (Vref8L, Vref8H) corresponds to code 111 (representing the 7th channel).

The first comparison circuit 31 may also comprise a plurality of comparators, such as a first comparator COMP1 and a second comparator COMP2 shown in FIG. 6. The first comparator COMP1 compares the first voltage Vsig with the upper limit voltage of the predetermined reference voltage range, and the second comparator COMP2 compares the first voltage Vsig with the lower limit voltage of the predetermined reference voltage range. For example, the positive phase input terminal of the first comparator COMP1 can receive the first voltage Vsig, and the inverting input terminal thereof can receive the upper limit voltage of the predetermined reference voltage range output by the first data selector MUX1. If the first voltage Vsig is larger than the upper limit voltage of the predetermined reference voltage range currently selected by the first data selector MUX1, then the first comparator COMP1 outputs a high level; if the first voltage Vsig is less than the upper limit voltage of the predetermined reference voltage range currently selected by the first data selector MUX1, then the first comparator COMP1 outputs a low level. The positive phase input terminal of the second comparator COMP2 can receive the lower limit voltage of the predetermined reference voltage range output by the second data selector MUX2, and the inverting input terminal can receive the first voltage Vsig. If the lower limit voltage of the predetermined reference voltage range currently selected by the second data selector MUX2 is larger than the first voltage Vsig, then the second comparator COMP2 outputs a high level; if the lower limit voltage of the predetermined reference voltage range currently selected by the second data selector MUX2 is less than the first voltage Vsig, then the second comparator COMP2 outputs a low level. For convenience in description, high levels can represent data "1", while low levels can represent data "0".

The counting circuit 32 may comprise a first logic or device OR1 and a counter CT1. Counter CT1 can be a binary counter with a number of bits equal to the encoded number of bits representing the predefined reference voltage range in the first comparison circuit 31. For example, when X=8 reference voltage ranges are predefined in the first comparison circuit 31, counter CT1 can be a $\log_2 X=3$ bit counter. The corresponding relationship between each reference voltage range in the X reference voltage ranges and the code of counter CT1 can be: Vref1 (Vref1L, Vref1H) corresponding to code 000, Vref2 (Vref2L, Vref2H) corresponding to code 001, Vref3 (Vref3L, Vref3H) corresponding to code 010, Vref4 (Vref4L, Vref4H) corresponding to code 011, Vref5 (Vref5L, Vref5H) corresponding to code 100, Vref6 (Vref6L, Vref6H) corresponding to code 101, Vref7 (Vref7L, Vref7H) corresponding to code 110, and Vref8 (Vref8L, Vref8H) corresponding to code 111. The first logic or device OR1 can perform logic or operations on the output of the first comparator COMP1 and the output of the second comparator COMP2. That is to say, when the first voltage Vsig is above the upper limit voltage selected by the first data selector MUX1 or below the lower limit voltage selected by the second data selector MUX2, the first logic or device OR1 outputs a high level; and when the first voltage Vsig falls within the voltage range defined by the upper limit voltage selected by the first data selector MUX1 and the lower limit voltage selected by the second data selector MUX2, the first logic or device OR1 outputs a low level. Counter CT1 counts when the first voltage Vsig exceeds the voltage range selected by the first data selector MUX1 and the second data selector MUX2, and generates a 3-bit counter code Q<2:0>. The counter code Q<2:0> is fed back to the first comparison circuit 31, and the first data selector MUX1 and the second data selector MUX2 both select a corresponding reference voltage range based on the counter code Q<2:0>. Until the first voltage Vsig falls within the reference voltage range selected by the first data selector MUX1 and the second data selector MUX2, both the first comparator COMP1 and the second comparator COMP2 output a low level, and the count value of counter CT1 no longer changes. Initially, the count code of counter CT1 can be 000, and the first data selector MUX1 and second data selector MUX2 select the minimum reference voltage range Vref1 (Vref1L, Vref1H) corresponding to the code 000.

When the predetermined time period expires, counter CT1 can be reset to the initial code 000.

The audio signal provided to the audio power amplifier 1, namely the first signal, is usually a sinusoidal AC voltage signal, and the edge detection circuit 35 is essentially used for edge detection of the first signal. Specifically, the second comparison circuit 34 may comprise a third comparator COMP3, which compares the first voltage Vsig with a reference voltage such as the common mode voltage Vcm of the first signal. The common mode voltage Vcm can also be referred to as the second voltage hereinafter. When the first voltage is above the second voltage, the second comparison circuit 34 can output a high-level signal to the edge detection circuit 35. When the first voltage is below the second voltage, the second comparison circuit 34 can output a low-level signal to the edge detection circuit 35. For example, the high-level signal may be a power signal VDD, and the low-level signal may be a ground signal GND. When the edge detection circuit 35 detects that the signal output by the second comparison circuit 34 changes from a low-level signal to a high-level signal, and generates a rising edge, and/or when changing from a high-level signal to a low-level signal and generating a falling edge, it can determine that the "edge" of the first signal is detected; that is, a case is detected that the first voltage is equal to the second voltage, then a pulse signal is output to the trigger circuit 33, to trigger the trigger circuit 33 to generate a target code. It can be understood that the edge detection circuit 35 can generate a pulse signal when a rising or falling edge is detected; that is, when a predetermined period of time equal to the first signal has passed, a pulse signal is generated. Pulse signals can also be generated when both the rising and falling edges are detected; that is, when a predetermined period of time equal to a half cycle of the first signal has passed, a pulse signal is generated. The pulse signal can be provided to the trigger circuit 33 to output the target code, and can also be provided as a reset signal RST to the counting circuit 32 to reset the count value of the counting circuit 32 to 000.

The trigger circuit 33 may comprise a trigger, such as a D Flip Flop (DFF). The trigger DFF has a memory function; that is, the trigger circuit 33 can store the previously determined target code BST<2:0>. The trigger circuit 33 can update the target code BST stored in the trigger circuit 33 itself with the current count value Q<2:0> of the count circuit 32 when the current count value Q<2:0> of the count circuit 32 is different from the target code BST<2:0> stored in trigger circuit 33, and the edge detection circuit 35 determines that the first voltage Vsig intersects (i.e. is equal) with the reference voltage Vcm, and then output the updated target code BST<2:0>. It can be understood that if the current count value Q<2:0> of the counting circuit 32 is the same as the target code BST<2:0> stored in the trigger circuit 33, the trigger circuit 33 does not need to update the target code BST<2:0>.

The control sub-circuit 12 can output the target code BST<2:0> to the supply power supply sub-circuit 13, and the supply power supply sub-circuit 13 can provide corresponding voltage to the audio power amplification circuit 20 based on the target code BST<2:0>, which will be further described in detail below.

Although FIG. 6 illustrates specific electronic components and circuits for implementing the first comparison circuit 31, the counting circuit 32, the trigger circuit 33, the second comparison circuit 34, and the edge detection circuit 35, it should be understood that other electronic components and circuits can also be used to implement these components to achieve the functions described above.

Figure 5:
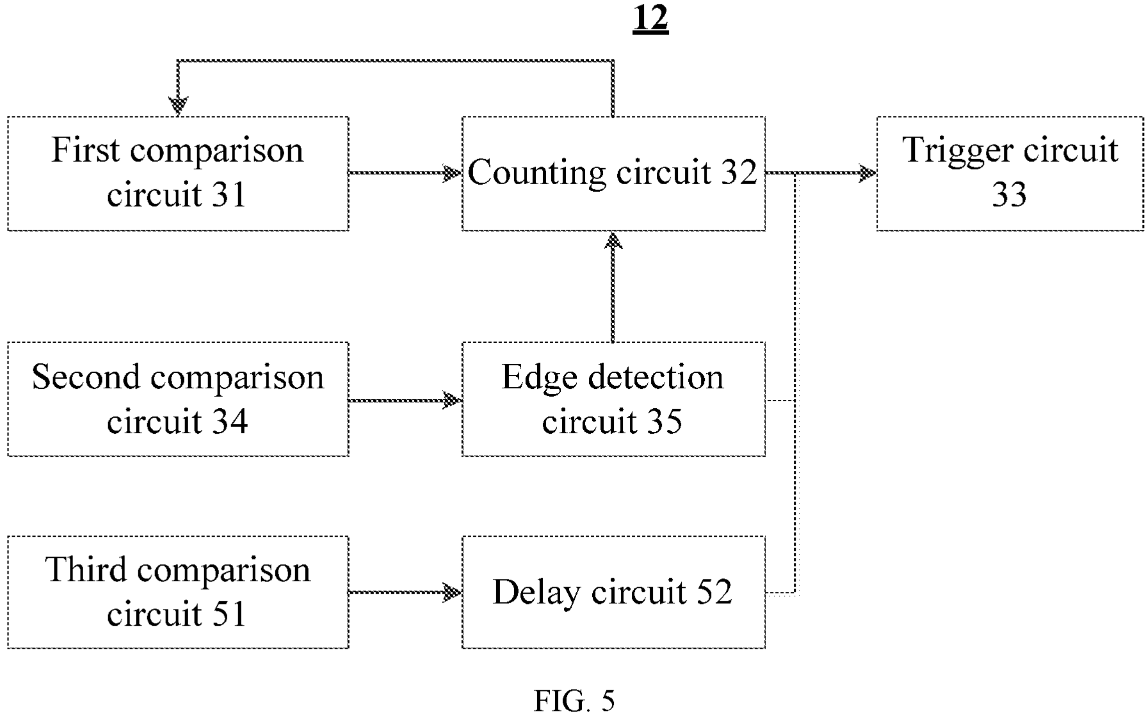
FIG. 5 is a block diagram of a control sub-circuit according to another embodiment of the present disclosure.

In some application scenarios, the voltage amplitude of the first signal varies irregularly, and there may be situations where the voltage amplitude of the first signal is small in the first half cycle and suddenly increases in the second half cycle. If, due to the small voltage amplitude of the first signal in the first half cycle, the power supply sub-circuit 13 provides a lower power supply voltage to the audio power amplification circuit 20 in response to the target code provided by the control sub-circuit 12, then when the voltage amplitude of the first signal suddenly increases in the second half cycle, the power supply voltage provided by the power supply sub-circuit 13 cannot meet the requirement for the output power of the audio power amplification circuit 20, and thus noise may occur. To avoid this issue, in some embodiments, the control sub-circuit 12 may also comprise a delay circuit for extending the time for determining the target code. As shown in FIG. 5, the control sub-circuit 12 can also comprise a third comparison circuit 51 and a delay circuit 52. The third comparison circuit 51 is used to compare the current count value Q<2:0> of the counting circuit 32 with the target code BST<2:0> stored in the trigger circuit 33, in order to determine whether the reference voltage range corresponding to the current count value Q<2:0> of the counting circuit 32 increases or decreases relative to the target reference voltage range corresponding to the target code BST<2:0> stored in the trigger circuit 33. If the reference voltage range corresponding to the current count value Q<2:0> increases relative to the target reference voltage range corresponding to the target code BST<2:0>, then when the edge detection circuit 35 determines that the first voltage Vsig intersects with the reference voltage Vcm, the trigger circuit 33 can update the target code BST<2:0> stored in it with the current count value Q<2:0> and output the updated target code. If the reference voltage range corresponding to the current count value Q<2:0> decreases relative to the target reference voltage range corresponding to the target code BST<2:0>, the delay circuit 52 starts to time for a predetermined duration. After the predetermined duration has elapsed, if the edge detection circuit 35 determines that the reference voltage range corresponding to the current count value Q<2:0> is still less than the target reference voltage range corresponding to the target code BST<2:0> when the first voltage Vsig intersects with the reference voltage Vcm, the trigger circuit 33 can update the target code BST<2:0> stored in it with the current count value Q<2:0> and output the updated target code. Here, the predetermined duration can be pre-set according to requirements, such as 250 milliseconds. The predetermined duration can be set to be above the duration corresponding to half, one, or more cycles of the first signal.

Referring to FIG. 6, the third comparison circuit 51 may comprise a digital comparator Dig COMP, which compares the current count value Q<2:0> of the counting circuit 32 with the target code BST<2:0> stored in the trigger circuit 33. The output of the digital comparator Dig COMP and the output of the edge detection circuit 35 can be provided to the first logic AND circuit AND1. When the edge detection circuit 35 detects the edge of the first signal (at which the first voltage Vsig is equal to the reference voltage Vcm), and the digital comparator Dig COMP determines that the current count value Q<2:0> of the counting circuit 32 is above the target code BST<2:0> stored in the trigger circuit 33, the first logic AND circuit AND1 outputs a high level or pulse signal to enable the trigger circuit 33 to update the target code BST<2:0> stored in the trigger circuit 33 with the current count value Q<2:0>, and output the updated target code. The output of the digital comparator Dig COMP is also provided to the delay circuit 52 through the inverter Inv1, and the output of the delay circuit 52 and the output of the edge detection circuit 35 are provided to the second logic AND circuit AND2. When the current count value Q<2:0> of the counting circuit 32 is below the target code BST<2:0> stored in the trigger circuit 33, the digital comparator Dig COMP outputs a low-level signal, which is inverted into a high-level signal by the inverter Inv1 and provided to the delay circuit 52. The delay circuit 52 starts to time for a predetermined duration in response to the high-level signal. When the current count value Q<2:0> is still below the target code BST<2:0> after the predetermined duration has passed, and the edge detection circuit 35 determines that the first voltage Vsig intersects with the reference voltage Vcm, the second logic AND circuit AND2 outputs a high-level signal, causing the trigger circuit 33 to update the stored target code BST<2:0> with the current count value Q<2:0> and output the updated target code. The output of the first logic AND circuit AND1 and the output of the second logic AND circuit AND2 can be provided to the second logic OR circuit OR2, and the outputs of the second logic OR circuit OR2 can be provided to the trigger circuit 33. As mentioned earlier, when the edge detection circuit 35 detects the edge of the first signal (at which the first voltage Vsig is equal to the reference voltage Vcm), and the digital comparator Dig COMP determines that the current count value Q<2:0> of the counting circuit 32 is above the target code BST<2:0> stored in the trigger circuit 33, the first logic AND circuit AND1 output a high level or pulse signal; when the edge detection circuit 35 detects the edge of the first signal (at which the first voltage Vsig is equal to the reference voltage Vcm), and after the delay circuit 52 delays for the predetermined duration, the digital comparator Dig COMP still determines that the current count value Q<2:0> of the counting circuit 32 is below the target code BST<2:0> stored in the trigger circuit 33, the second logic AND circuit AND2 outputs a high level or pulse signal. When either of the first logic AND circuit AND1 or the second logic AND circuit AND2 outputs a high level or pulse signal, the second logic OR circuit OR2 outputs a high level or pulse signal to indicate that the trigger circuit 33 updates the stored target code BST<2:0> with the current count value Q<2:0> and outputs the updated target code.

Below is a brief overview of the operation process of the control sub-circuit 12 shown in FIG. 6. After the first voltage Vsig detected by the detection sub-circuit 11 is input to the control sub-circuit 12, the first data selector MUX 1 selects the upper limit voltage VrefH of the corresponding reference voltage range based on the count value Q<2:0> output by the counter CT1, and outputs it to the first comparator COMP1; the first comparator COMP1 compares the first voltage Vsig with the upper limit voltage VrefH of the selected reference voltage range, and outputs a high-level signal when Vsig is above VrefH, and a low-level signal when Vsig is below VrefH. Meanwhile, the second data selector MUX2 selects the lower limit voltage VrefL of the corresponding reference voltage range based on the count value Q<2:0> output by counter CT1, and outputs it to the second comparator COMP2; the second comparator COMP2 compares the first voltage Vsig with the lower limit voltage VrefL of the selected reference voltage range, and outputs a high-level signal when Vsig is below VrefL, and a low-level signal when Vsig is above VrefL.

The two level signals output by the first comparator COMP1 and the second comparator COMP2 are input to the first logic OR circuit OR1, which outputs a high level signal when either of the two input level signals is a high level signal. At this time, the first voltage Vsig is above the VrefH of the current target reference voltage or Vsig is below the VrefL of the current target reference voltage; namely the first voltage Vsig is outside the reference voltage range (VrefL, VrefH) selected by the first and second data selectors MUX1 and MUX2 based on the counter CT1 output count value Q<2:0>; the first logic OR circuit OR1 outputs a low-level signal when both input level signals are low-level signals. At this time, the first voltage Vsig is below the upper limit voltage VrefH of the currently selected reference voltage range and above the lower limit voltage VrefL of the currently selected reference voltage range; namely the first voltage Vsig falls within the reference voltage range (VrefL, VrefH) selected by the first and second data selectors MUX1 and MUX2 based on the count value Q<2:0> output by counter CT1. Counter CT1 counts the high-level signal output by the first logic OR circuit OR1, and the count value Q<2:0> changes in the order of "000→001 →010→011→100→101→110→111". Different count values Q<2:0> correspond to different reference voltage ranges: Q<2:0> for a case in which 000 corresponds to Vref1 (Vref1L, Vref1H), Q<2:0> for a case in which 001 corresponds to Vref2 (Vref2L, Vref2H), Q<2:0> for a case in which 010 corresponds to Vref3 (Vref3L, Vref3H), Q<2:0> for a case in which 011 corresponds to Vref4 (Vref4L, Vref4H), Q<2:0> for a case in which 100 corresponds to Vref5 (Vref5L, Vref5H), Q<2:0> for a case in which 101 corresponds to Vref6 (Vref6L, Vref6H), Q<2:0> for a case in which 110 corresponding to Vref7 (Vref7L, Vref7H), Q<2:0> for a case in which 111 corresponds to Vref8 (Vref8L, Vref8H); therefore, as the count value Q<2:0> changes, the reference voltage range selected by the first and second data selectors MUX1 and MUX2 changes in the order of "Vref1→Vref2→Vref3→Vref4→Vref5→Vref6→Vref7→Vref8".

Figure 4:
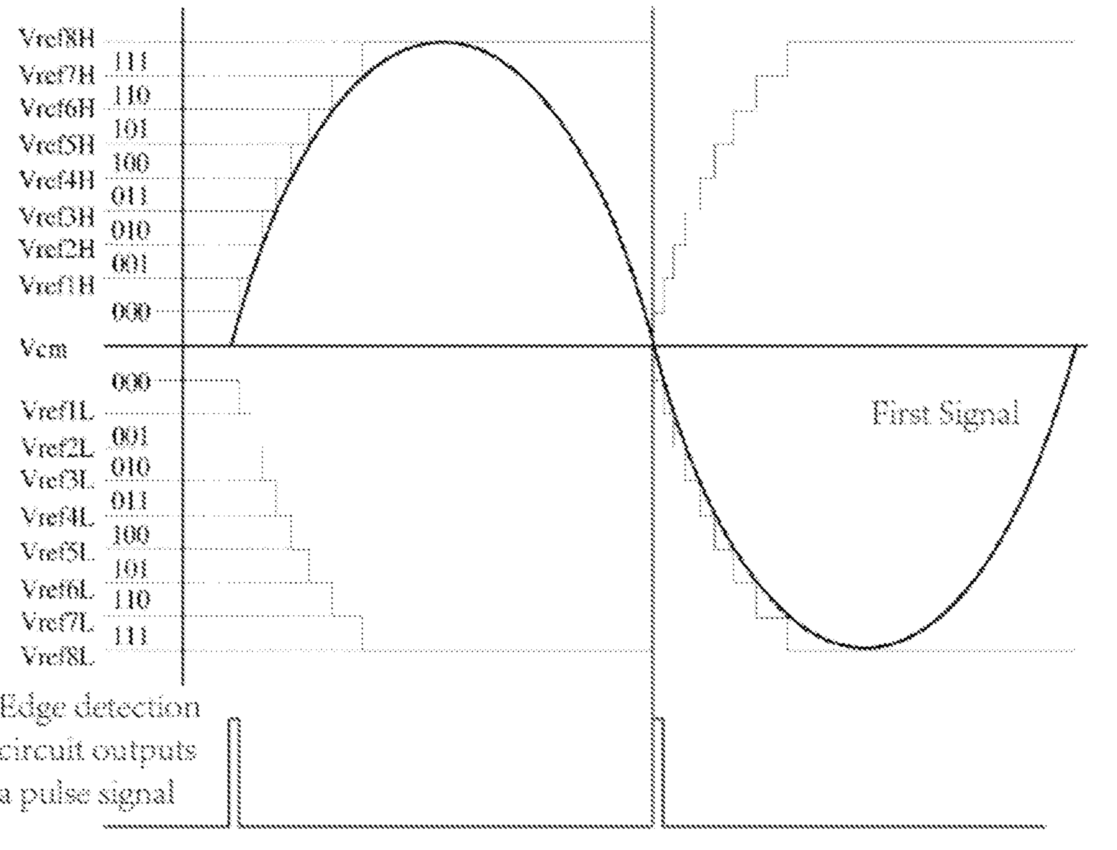
FIG. 4 is a schematic diagram of the moment for outputting a pulse signal by the edge detection circuit according to an embodiment of the present disclosure.

In some examples, the first signal may not be a regular sine wave signal as shown in FIG. 4. For example, the voltage amplitude of the first signal may be small in the first half cycle and suddenly increase in the second half cycle. Therefore, the order of change in the count value Q<2:0> in the first and second half cycles, and the order of change in the reference voltage range selected by the first and second data selectors MUX1 and MUX2, may also be different. For example, the peak of the voltage amplitude of the first signal in the first half cycle is $V_H$, and the peak of the voltage amplitude in the second half cycle is $V_L$; that is, the maximum value of the first voltage Vsig in the current cycle is $V_H$, and the minimum value of Vsig in the current cycle is $V_L$. Assuming that $V_H$ is below Vref3H and above Vref2H, $V_L$ is below Vref5L and above Vref6L, in the first half cycle of the first signal, during that Vsig gradually increases to $V_H$, Q<2:0> changes in the order of "000→001→010", and as Q<2:0> changes, the reference voltage range selected by the first and second data selectors MUX1 and MUX2 changes in the order of "Vref1→Vref2→Vref3"; in the second half cycle of the first signal, during the gradual reduction of Vsig to $V_L$, Q<2:0> changes in the order of "000→001→010→011→100→101". As Q<2:0> changes, the reference voltage range selected by the first and second data selectors MUX1 and MUX2 changes in the order of "Vref1→Vref2→Vref3→Vref4→Vref5→Vref6".

The third comparator COMP3 compares the first voltage Vsig detected by the detection sub-circuit 11 with the reference voltage, such as the common mode voltage Vcm of the audio signal, to determine the timing when the first signal passes through the common mode voltage Vcm.

When Vsig is below Vcm, the third comparator COMP3 outputs a low-level signal. When Vsig is above Vcm, the third comparator COMP3 outputs a high-level signal. When the edge detection circuit 35 detects that the output signal of the third comparator COMP3 changes from a low level signal to a high level signal, and/or from a high level signal to a low level signal, it determines that the first signal upward/downward passes through the common mode voltage Vcm, and outputs a reset pulse signal to the counter CT1 to reset the count value Q<2:0> to the initial value 000. In this way, each time the first signal passes through the common mode voltage Vcm, the count value Q<2:0> is reset to the initial value 000, and its corresponding reference voltage range is Vref1 (Vref1L, Vref1H). When the first voltage Vsig falls outside the reference voltage range Vref1, the count value Q<2:0> of counter CT1 increases from 000 to 001, and the reference voltage range selected by the first and second data selectors MUX1 and MUX2 based on the count value Q<2:0> is changed to Vref2 (Vref2L, Vref2H). Repeat this process until the first voltage Vsig falls within the reference voltage range selected by the first and second data selectors MUX1 and MUX2, or until the counter CT1 reaches the maximum count value.

The digital comparator Dig COMP compares the current count value Q<2:0> of counter CT1 with the target code BST<2:0> stored in trigger circuit 33. When Q<2:0> is above BST<2:0>, Dig COMP outputs a high-level signal, and when Q<2:0> is below BST<2:0>, Dig COMP outputs a low-level signal. When Q<2:0> is above BST<2:0>(indicating that the current selected reference voltage range corresponding to Q<2:0> is above the target reference voltage range of the previous output corresponding to BST<2:0>) and the first signal passes through the common mode voltage Vcm, the second logic or device OR2 outputs a high level signal or pulse signal to the trigger DFF, and the trigger DFF updates the target code BST<2:0> stored in the trigger DFF in response to the high level or pulse signal output by the second logic or updating the target code BST stored in the trigger DFF with the current count value Q<2:0> of counter CT1, and outputs the updated target code BST<2:0> to control the power supply sub-circuit 13 to provide the corresponding power supply voltage. When Q<2:0> is below BST<2:0>(indicating that the current selected reference voltage range corresponding to Q<2:0> falls within the target reference voltage range of the previous output corresponding to BST<2:0>), the digital comparator Dig COMP outputs a low-level signal that is transformed into a high-level signal by inverter Inv1 and supplied to the delay circuit 52. The delay circuit 52 starts to time for a predetermined duration in response to the high-level signal. When the counting period expires and the digital comparator Dig COMP still outputs a low-level signal, if the edge detection circuit 35 determines that the first voltage Vsig passes through the common mode voltage Vcm, the second logic AND circuit AND2 output a high-level signal, causing the second logic OR circuit OR2 to output a high-level signal. The trigger DFF updates the target code BST<2:0> stored in the trigger DFF with the current count value Q<2:0> of counter CT1 in response to the high-level signal, and output the updated target code BST<2:0> to control the power supply sub-circuit 13 to provide the corresponding power supply voltage. In this way, the delay circuit 52 can avoid the problem that the voltage amplitude of the first signal is small in the first half cycle and suddenly increases in the second half cycle, and thus the power supply voltage provided by the power supply sub-circuit 13 based on the voltage amplitude of the first signal in the first half cycle is insufficient to meet the output power of the audio power amplification circuit 20 when the voltage amplitude of the first signal increases in the second half cycle.

For example, based on the embodiment corresponding to FIG. 6, assuming Vcm is equal to 40V; Q<2:0>000 corresponds to Vref1 (35V, 45V); Q<2:0>001 corresponds to Vref2 (30V, 50V); Q<2:0>010 corresponds to Vref3 (25V, 55V); Q<2:0>011 corresponds to Vref4 (20V, 60V); Q<2:0>100 corresponds to Vref5 (15V, 65V); Q<2:0>101 corresponds to Vref6 (10V, 70V); Q<2:0>110 corresponds to Vref7 (5V, 75V V); Q<2:0>111 corresponds to Vref8 (0V, 80V); and assuming that the peak voltage amplitude of the first signal in the first half cycle is 48V, and the peak voltage amplitude in the second half cycle is 26V; that is, the maximum value of Vsig in the first cycle is 48V, and the minimum value is 26V. At the same time, assuming that the BST<2:0> stored by the trigger DFF in the previous cycle is 001, and the initial value of Vsig in the first cycle is 40V; then, for the first cycle of the first signal, during the gradual increase of Vsig from 40V, Q<2:0> is the initial value of 000, and the target reference voltage determined by MUX1 and MUX2 is Vref1 (35V, 45V). When Vsig is below 45V and is above 40V, both MUX1 and MUX2 output a low-level signal, and OR1 also outputs a low-level signal, which cannot trigger the counter CT's count value to increase by 1, that is, Q<2:0> is still 000. At this time, Vsig is above Vcm, COMP3 continuously outputs a high-level signal, but the edge detection circuit 35 does not detect the signal edge, so BST<2:0> remains at 001; when Vsig increases to above 45V, MUX1 outputs a high-level signal, and MUX2 outputs a low-level signal, and then OR1's output signal changes from a low-level signal to a high-level signal, generating a rising edge. This triggers the counter CT1's count value Q<2:0> to increase by 1, from 000 to 001. The reference voltage range selected by MUX1 and MUX2 changes from Vref1 (35V, 45V) to Vref2 (30V, 50V). At this time, Vsig is above Vcm, and COMP3 continuously outputs a high-level signal, the edge detection circuit 35 has not yet detected the signal edge of the first signal, so BST<2:0> remains at 001. During the process of Vsig increasing to the peak value of 48V and decreasing to 40V, MUX1 and MUX2 both output a low-level signal, while OR1 also outputs a low-level signal. In this case, counter CT1 does not count, meaning that the count value Q<2:0> is still 001, and the reference voltage range selected by MUX1 and MUX2 remains Vref2 (30V, 50V) until Vsig decreases to 40V, then the edge detection circuit 35 detects the edge of the first signal and outputs a pulse signal, and Counter CT1 resets the count value Q<2:0> from 001 to the initial value 000 in response to the pulse signal output by edge detection circuit 35. Before Q<2:0> is reset to its initial value, the trigger circuit 33 compares the count value Q<2:0>001 with its stored target code BST<2:0>001. Since the two are the same, the trigger circuit 33 does not update the target code BST<2:0>, and BST<2:0> remains 001. It can be seen that in the first half of the first cycle, during the process of Vsig gradually increasing from 40V to the peak voltage amplitude of 48V and then decreasing to 40V, Q<2:0> changes in the order of "000→001→000". As Q<2:0> changes, the reference voltage range selected by MUX1 and MUX2 changes in the order of "Vref1→Vref2→Vref1", while BST<2:0> remains unchanged at 001. In the second half of the first cycle, similar to the above process, during the process of Vsig gradually decreasing from 40V to the minimum value of 26V and then increasing to 40V, Q<2:0> changes in the order of "000→001→010→000". As Q<2:0> changes, the reference voltage range selected by MUX1 and MUX2 changes in the order of "Vref1→Vref2→Vref3→Vref1". When Vsig increases to 40V, the edge detection circuit 35 detects the edge of the first signal and outputs a pulse signal. At this time, Q<2:0> is 010, which is above the BST<2:0>001 stored in the trigger circuit 33. The digital comparator Dig COMP also outputs a high-level signal, causing AND1 to output a high-level signal, and then OR2 to output a high-level signal. The trigger DFF updates its stored target code BST<2:0> with the counter CT1's count value Q<2:0>010 in response to the high-level signal, and outputs the updated target code BST<2:0>010.

Figures 7, 8:
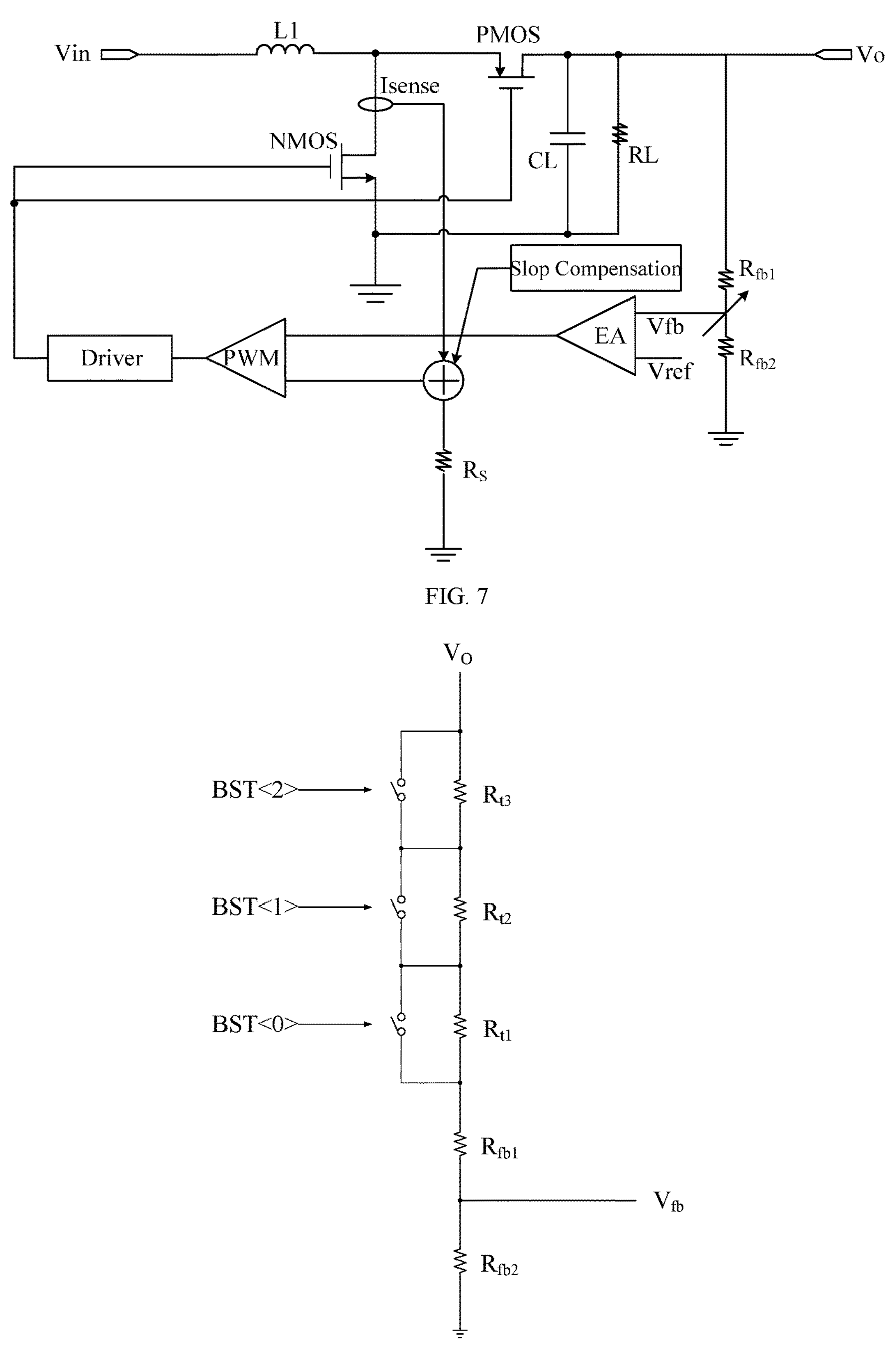
FIG. 7 is a circuit diagram of a power supply sub-circuit according to an embodiment of the present disclosure.
FIG. 8 is a circuit diagram of a feedback resistor adjustment component in a power supply sub-circuit according to an embodiment of the present disclosure.

For example, the power supply sub-circuit 13 can be a boost type DC-DC circuit, as shown in FIG. 7. The principle of the boost type DC-DC circuit is known and will not be described in detail here. The negative feedback control loop in the power supply sub-circuit 13 will embed one input voltage $V_{fb}$ of error amplifier EA to be equal to its other input voltage $V_{ref}$, wherein $V_{ref}$ is the reference voltage for the power supply sub-circuit 13 and $V_{fb}$ is the feedback voltage for the power supply sub-circuit 13. Based on this principle, the following formula can be obtained:

$$V_o = \left(1 + \frac{R_{fb1}}{R_{fb2}}\right) * V_{ref}, \tag{6}$$

where $V_O$ represents the output voltage of the supply power supply sub-circuit 13, and $R_{fb1}$ and $R_{fb2}$ represent the feedback resistance of the supply power supply sub-circuit 13. It can be seen that the power supply sub-circuit 13 can adjust the output voltage $V_O$ by adjusting its own feedback resistors $R_{fb1}$ and $R_{fb2}$ or its own reference voltage $V_{ref}$. Therefore, in some embodiments, a supply voltage that matches the output power of the audio power amplifier 1 can be generated by adjusting the feedback resistance or reference voltage of the power supply sub-circuit 13.

In an embodiment, a plurality of switches can be controlled using a target code output from control sub-circuit 12 to connect or disconnect a plurality of resistors, thereby causing the feedback resistance ratio of power supply sub-circuit 13 to change, and then generating a supply voltage that matches the output power of audio power amplifier 1 by power supply sub-circuit 13. For example, as shown in FIG. 8, the power supply sub-circuit 13 comprises feedback resistors $R_{t3}$, $R_{t2}$, and $R_{t1}$. Each feedback resistor $R_{t3}$, $R_{t2}$, and $R_{t1}$ has parallel switches that can be connected or shorted through BST<2:0> to adjust the feedback resistance ratio of the power supply sub-circuit 13. For example, when BST<2:0> is 010, $R_{t3}$ and $R_{t1}$ are connected, and $R_{t2}$ is short circuited. At this time, the feedback resistance ratio of power supply sub-circuit 13 can be calculated using the following formula:

$$\frac{V_{fb}}{V_o} = \frac{R_{fb2}}{R_{fb2} + R_{fb1} + R_{t1} + R_{t2}} \tag{7}$$

Based on formula (7), now the output voltage of the power supply sub-circuit 13 can be calculated using the following formula:

$$V_o = \left(1 + \frac{R_{fb1} + R_{t1} + R_{t2}}{R_{fb2}}\right) * V_{fb}\left(1 + \frac{R_{fb1} + R_{t1} + R_{t2}}{R_{fb2}}\right) * V_{ref} \tag{8}$$

Figures 9, 10:
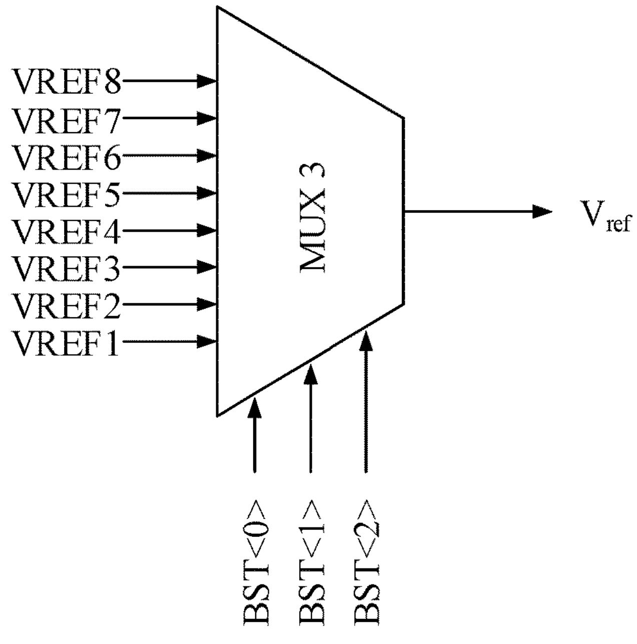
FIG. 9 is a circuit diagram of a reference voltage regulating component for a power supply sub-circuit according to an embodiment of the present disclosure.
FIG. 10 is a schematic diagram showing the variation of the output voltage of a power supply sub-circuit with the output voltage of an audio power amplifier according to an embodiment of the present disclosure.

In some embodiments, the target code output by the control sub-circuit 12 may be used to control the reference voltage $V_{ref}$ used by the power supply sub-circuit 13 to adjust the power supply voltage generated by the power supply sub-circuit 13. For example, as shown in FIG. 9, the supply power supply sub-circuit 13 comprises a third data selector MUX3, which selectively outputs one of X input signals as the reference voltage $V_{ref}$ used in the supply power supply sub-circuit 13, where $\log_2 X$ is the number of bits of the target code BST<2:0>. For example, when $\log_2 X=3$, the third data selector MUX3 has 8 input signals $V_{ref1}$ to $V_{ref8}$. According to the value of the target code BST<2:0>, the third data selector MUX3 can selectively output one of the 8 input signals $V_{ref1}$ to $V_{ref8}$ as $V_{ref}$, so that the power supply sub-circuit 13 can generate the corresponding power supply voltage, which can be calculated by formula (6). FIG. 10 shows in an example the output voltage $V_O$ of the power supply sub-circuit 13 can vary with the output voltage $V_{O\_PowerAmplifier}$ of the audio power amplifier 1.

Figures 11, 12:
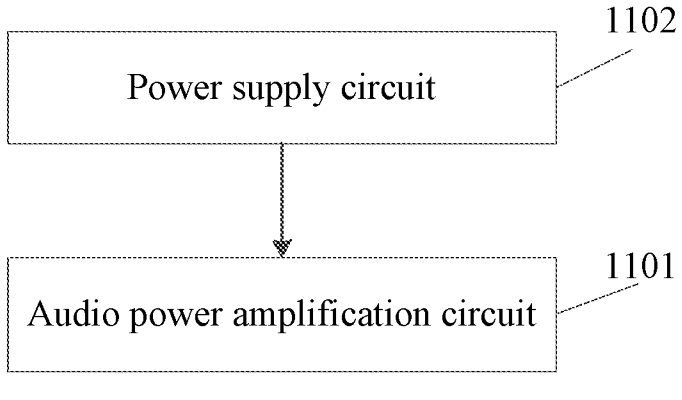
FIG. 11 is a block diagram of an audio power amplifier according to an embodiment of the present disclosure.
FIG. 12 is a flowchart of a method for supplying power to an audio power amplifier according to an embodiment of the present disclosure.

Based on the above power supply circuit, an embodiment of the present disclosure also provides an audio power amplifier. As shown in FIG. 11, the audio power amplifier comprises an audio power amplification circuit 1101 and a power supply circuit 1102. The power supply circuit 1102 is the power supply circuit described in any of the above embodiments of the power supply circuit. The power supply circuit 1102 supplies power to the audio power amplifier by supplying power to the audio power amplifier circuit 1101. The audio power amplification circuit 1101 is a digital audio power amplification circuit or an analog audio power amplification circuit.

Based on the aforementioned power supply circuit, an embodiment of the present disclosure also provides an integrated circuit, comprising the audio power amplifier shown in FIG. 11.

Based on the above power supply circuit, an embodiment of the present disclosure further provides an electronic device, comprising a speaker and the audio power amplifier shown in FIG. 11. The audio power amplifier provides an audio signal to the speaker after amplifying the audio signal.

Based on the above power supply circuit, an embodiment of the present disclosure also provides a power supply method applied to an audio power amplifier. As shown in FIG. 12, the method comprises the following steps:

Step 1201: detecting a first voltage of an audio signal provided to the audio power amplifier to determine output power of the audio power amplifier;

Step 1202: determining a target reference voltage range based on a voltage range of the audio signal within a predetermined time period, wherein the target reference voltage range is selected from a plurality of predetermined reference voltage ranges, and the voltage range of the audio signal within the predetermined time period is included within the target reference voltage range;

Step 1203: based on the target reference voltage range, generating a power supply voltage that matches the output power of the audio power amplifier to supply power to the audio power amplifier.

In some embodiments, determining the target reference voltage range comprises: selecting a reference voltage range from the plurality of predetermined reference voltage ranges by a first comparison circuit and comparing it with the voltage of the audio signal; and counting by a counting circuit when the voltage of the audio signal exceeds the selected reference voltage range. The first comparison circuit selects a next predetermined reference voltage range based on a count value of the counting circuit, until the voltage of the audio signal falls within the selected reference voltage range.

In some embodiments, determining the target reference voltage range further comprises: comparing the voltage of the audio signal with a reference voltage by a second comparison circuit; determining a moment at which the audio signal intersects with the reference voltage by detecting an output of the second comparison circuit by an edge detection circuit, thereby determining the predetermined time period; and when the edge detection circuit determines that the audio signal intersects with the reference voltage and a current count value of the counting circuit is different from a count value stored in a trigger circuit, updating the count value stored in the trigger circuit with the current count value of the counting circuit, and outputting the updated count value by the trigger circuit, wherein the count value output by the trigger circuit indicates the target reference voltage range.

In some embodiments, the method further comprises: providing a reset signal to the counting circuit to reset the count value of the counting circuit when the edge detection circuit determines that the audio signal intersects with the reference voltage.

In some embodiments, determining the target reference voltage range further comprises: comparing the current count value of the counting circuit with the count value stored in the trigger circuit by a third comparison circuit to determine whether a reference voltage range corresponding to the current count value of the counting circuit increases or decreases relative to a reference voltage range corresponding to the count value stored in the trigger circuit; and when the third comparison circuit determines that the reference voltage range corresponding to the current count value of the counting circuit increases relative to the reference voltage range corresponding to the count value stored in the trigger circuit, and the edge detection circuit determines that the audio signal intersects with the reference voltage, updating the count value stored in the trigger circuit with the current count value of the counting circuit, and outputting the updated count value by the trigger circuit.

In some embodiments, determining the target reference voltage range further comprises: starting to time for a predetermined duration by a delay circuit when the third comparison circuit determines that the reference voltage range corresponding to the current count value of the counting circuit decreases relative to the reference voltage range corresponding to the count value stored in the trigger circuit; and when the third comparison circuit still determines that the reference voltage range corresponding to the current count value of the counting circuit decreases relative to the reference voltage range corresponding to the count value stored in the trigger circuit after passing the predetermined duration, and the edge detection circuit determines that the audio signal intersects with the reference voltage, updating the count value stored in the trigger circuit with the current count value of the count circuit, and outputting the count value by the trigger circuit.

In some embodiments, generating a power supply voltage that matches the output power of the audio power amplifier comprises: adjusting a resistance value of a feedback resistor used in the power supply sub-circuit according to the target reference voltage range or selecting a reference voltage used in the power supply sub-circuit, so as to generate a voltage that matches the output power of the audio power amplifier.

The above describes the basic principles of the present disclosure in conjunction with specific embodiments. However, it should be pointed out that the advantages, merits, effects, etc. mentioned in the present disclosure are only examples and not limitations, and cannot be considered as essential for each embodiment of the present disclosure. In addition, the specific details disclosed above are only for the purpose of providing examples and facilitating understanding, and are not used for limitation. The above details do not limit that the present disclosure has to adopt the above specific details for its implementation. However, under the guidance of this disclosure, those skilled in the art easily think of many changes in form and details, which should fall within the scope of the claims of this disclosure.

The block diagrams of the devices, apparatuses, equipment, and systems referred to in this disclosure are only illustrative examples and are not intended to require or imply that they must be connected, arranged, or configured in the manner shown in the block diagram. As technicians in this field will recognize, these devices, apparatuses, equipment, and systems can be connected, arranged, and configured in any way. Words such as “comprising”, “including”, “having”, “containing” and so on are open-ended terms that refer to “comprising but not limited to” and can be interchanged with them. The words “or” and “and” used here refer to the words “and/or” and can be used interchangeably with them, unless the context clearly indicates otherwise. The phrase “such as” used here refers to the phrase “such as but not limited to” and can be used interchangeably with it.

It should also be pointed out that in the apparatus, equipment, and method of the present disclosure, each component or step can be decomposed and/or reassembled. These decompositions and/or recombination should be considered equivalent solutions to this application.

The above description of the disclosed aspects is provided to enable any person skilled in the art to make or use this application. The various modifications to these aspects are very apparent to those skilled in the art, and the general principles defined herein can be applied to other aspects without departing from the scope of this application. Therefore, the present disclosure is not intended to be limited to the aspects shown here, but rather to the widest range consistent with the principles and novel features disclosed herein.

The above description has been provided for the purpose of illustration and description. Furthermore, this description is not intended to limit the embodiments of this application to the form disclosed herein. Although a plurality of exemplary aspects and embodiments have been discussed above, those skilled in the art will recognize certain variations, modifications, changes, additions, and sub-combinations thereof.

What is claimed is:

1. A power supply circuit for an audio power amplifier, comprising:

a detection sub-circuit for detecting a voltage of an audio signal input to the audio power amplifier, wherein the voltage of the audio signal corresponds to output power of the audio power amplifier;

a control sub-circuit for determining a target reference voltage range based on a voltage range of the audio signal within a predetermined time period, wherein the target reference voltage range is selected from a plurality of predetermined reference voltage ranges, and the voltage range of the audio signal within the predetermined time period is included within the target reference voltage range; and a power supply sub-circuit for generating a power supply voltage that matches the output power of the audio power amplifier based on the target reference voltage range, so as to supply power to the audio power amplifier.

2. The power supply circuit according to claim 1, wherein the plurality of predetermined reference voltage ranges comprise a first reference voltage range and a second reference voltage range, wherein a lower limit value of the first reference voltage range is larger than a lower limit value of the second reference voltage range, and an upper limit value of the first reference voltage range is less than an upper limit value of the second reference voltage range.

3. The power supply circuit according to claim 1, wherein the control sub-circuit comprises:

a first comparison circuit for selecting a reference voltage range from the plurality of predetermined reference voltage ranges and comparing it with a voltage of the audio signal detected by the detection sub-circuit;

a counting circuit for counting when the first comparison circuit determines that the voltage of the audio signal exceeds the reference voltage range selected by the first comparison circuit, wherein a count value of the counting circuit is fed back to the first comparison circuit, and the first comparison circuit selects a next predetermined reference voltage range based on the count value of the counting circuit until the voltage of the audio signal falls within the reference voltage range selected by the first comparison circuit.

4. The power supply circuit according to claim 3, wherein the first comparison circuit comprises:

a first data selector for selecting and outputting an upper limit value of one of the plurality of predetermined reference voltage ranges;

a first comparator, wherein a positive phase input terminal thereof receives the voltage of the audio signal detected by the detection sub-circuit, and a negative phase input terminal thereof receives an output of the first data selector;

a second data selector for selecting and outputting a lower limit value of one of the plurality of predetermined reference voltage ranges; and a second comparator, wherein a positive phase input terminal thereof receives an output of the second data selector, and a negative phase input terminal thereof receives the voltage of the audio signal detected by the detection sub-circuit.

5. The power supply circuit according to claim 4, wherein the counting circuit comprises:

a first logic OR circuit for performing a logic or operation on the output of the first comparator and the output of the second comparator; and a counter for counting an output signal of the first logic OR circuit, wherein a count value of the counter is fed back to the first data selector and the second data selector, and the first data selector and the second data selector both select a corresponding reference voltage range from the plurality of predetermined reference voltage ranges based on the count value.

6. The power supply circuit according to claim 3, wherein the control sub-circuit further comprises:

a second comparison circuit for comparing the voltage of the audio signal detected by the detection sub-circuit with a reference voltage;

an edge detection circuit for determining a moment at which the audio signal intersects with the reference voltage by detecting an output of the second comparison circuit, thereby determining the predetermined time period; and a trigger circuit for updating a count value stored in the trigger circuit with a current count value of the counting circuit, and outputting the updated count value, when the edge detection circuit determines that the audio signal intersects with the reference voltage, and the current count value of the counting circuit is different from the count value stored in the trigger circuit, wherein the count value output by the trigger circuit indicates the target reference voltage range.

7. The power supply circuit according to claim 6, wherein the reference voltage is a common mode voltage of the audio signal.

8. The power supply circuit according to claim 6, wherein the edge detection circuit determines the moment at which the audio signal upward/downward passes through the reference voltage by detecting a rising and/or falling edges of an output signal of the second comparison circuit.

9. The power supply circuit according to claim 6, wherein the edge detection circuit further outputs a reset signal to the counting circuit to reset the count value of the counting circuit when determining that the audio signal interacts with the reference voltage.

10. The power supply circuit according to claim 6, wherein the control sub-circuit further comprises:

a third comparison circuit for comparing the current count value of the counting circuit with the count value stored in the trigger circuit to determine whether a reference voltage range corresponding to the current count value of the counting circuit increases or decreases relative to a reference voltage range corresponding to the count value stored in the trigger circuit, wherein when the third comparison circuit determines that the reference voltage range corresponding to the current count value of the counting circuit increases relative to the reference voltage range corresponding to the count value stored in the trigger circuit, and the edge detection circuit determines that the audio signal intersects with the reference voltage, the trigger circuit updates the count value stored in the trigger circuit with the current count value of the counting circuit, and output the updated count value.

11. The power supply circuit according to claim 10, wherein the control sub-circuit further comprises:

a delay circuit for starting to time for a predetermined duration when the third comparison circuit determines that the reference voltage range corresponding to the current count value of the counting circuit decreases relative to the reference voltage range corresponding to the count value stored in the trigger circuit, wherein when the third comparison circuit still determines that the reference voltage range corresponding to the current count value of the counting circuit decreases relative to the reference voltage range corresponding to the count value stored in the trigger circuit after the predetermined duration, and the edge detection circuit determines that the audio signal intersects with the reference voltage, the trigger circuit updates the count value stored in the trigger circuit with the current count value of the counting circuit, and outputs the updated count value.

12. The power supply circuit according to claim 1, wherein the power supply sub-circuit adjusts a resistance value of a feedback resistor in the power supply sub-circuit based on a signal received from the control sub-circuit indicating the target reference voltage range, so as to generate a voltage that matches the output power of the audio power amplifier.

13. The power supply circuit according to claim 1, wherein the power supply sub-circuit selects a reference voltage used in the power supply sub-circuit based on a signal received from the control sub-circuit indicating the target reference voltage range, so as to generate a voltage that matches the output power of the audio power amplifier.

14. A method of supplying power to an audio power amplifier, comprising:

detecting a voltage of an audio signal input to the audio power amplifier, wherein the voltage of the audio signal corresponds to output power of the audio power amplifier;

determining a target reference voltage range based on a voltage range of the audio signal within a predetermined time period, wherein the target reference voltage range is selected from a plurality of predetermined reference voltage ranges, and the voltage range of the audio signal within the predetermined time period is included within the target reference voltage range; and based on the target reference voltage range, generating a power supply voltage that matches the output power of the audio power amplifier to supply power to the audio power amplifier.

15. The method according to claim 14, wherein determining the target reference voltage range comprises:

selecting a reference voltage range from the plurality of predetermined reference voltage ranges and comparing it with the voltage of the audio signal by a first comparison circuit; and counting by the counting circuit when the voltage of the audio signal exceeds the selected reference voltage range, wherein the first comparison circuit selects a next predetermined reference voltage range based on a count value of the counting circuit, until the voltage of the audio signal falls within the selected reference voltage range.

16. The method according to claim 15, wherein determining the target reference voltage range further comprises:

comparing the voltage of the audio signal with a reference voltage by a second comparison circuit;

determining a moment at which the audio signal intersects with the reference voltage by detecting an output of the second comparison circuit by an edge detection circuit, thereby determining the predetermined time period; and when the edge detection circuit determines that the audio signal intersects with the reference voltage and a current count value of the counting circuit is different from a count value stored in a trigger circuit, updating the count value stored in the trigger circuit with the current count value of the counting circuit and outputting the updated count value by the trigger circuit, and providing a reset signal to the counting circuit so as to reset the count value of the counting circuit, wherein the count value output by the trigger circuit indicates the target reference voltage range.

17. The method according to claim 16, wherein determining the target reference voltage range further comprises:

comparing the current count value of the counting circuit with the count value stored in the trigger circuit by a third comparison circuit, so as to determine whether a reference voltage range corresponding to the current count value of the counting circuit increases or decreases relative to a reference voltage range corresponding to the count value stored in the trigger circuit; and when the third comparison circuit determines that the reference voltage range corresponding to the current count value of the counting circuit increases relative to the reference voltage range corresponding to the count value stored in the trigger circuit, and the edge detection circuit determines that the audio signal intersects with the reference voltage, updating the count value stored in the trigger circuit with the current count value of the counting circuit and outputting the updated count value by the trigger circuit.

18. The method according to claim 17, wherein determining the target reference voltage range further comprises:

when the third comparison circuit determines that the reference voltage range corresponding to the current count value of the counting circuit decreases relative to the reference voltage range corresponding to the count value stored in the trigger circuit, starting to time for a predetermined duration by a delay circuit; and when the third comparison circuit still determines that the reference voltage range corresponding to the current count value of the counting circuit decreases relative to the reference voltage range corresponding to the count value stored in the trigger circuit after the predetermined duration, and the edge detection circuit determines that the audio signal intersects with the reference voltage, updating the count value stored in the trigger circuit with the current count value of the count circuit and outputting the count value by the trigger circuit.

19. The method according to claim 14, wherein generating a power supply voltage that matches the output power of the audio power amplifier comprises:

adjusting a resistance value of a feedback resistor used in a power supply sub-circuit according to the target reference voltage range or selecting a reference voltage used in the power supply sub-circuit, to generate a voltage that matches the output power of the audio power amplifier.

20. An electronic device, comprising:

an audio power amplifier, which receives an audio signal and amplifies the audio signal; and a speaker for playing the audio signal, wherein the audio power amplifier comprises an audio power amplification circuit; and a power supply circuit which is used to provide power for the audio power amplification circuit, and wherein the power supply circuit comprises:

a detection sub-circuit for detecting a voltage of an audio signal input to the audio power amplifier, wherein the voltage of the audio signal corresponds to output power of the audio power amplifier;

a control sub-circuit for determining a target reference voltage range based on a voltage range of the audio signal within a predetermined time period, wherein the target reference voltage range is selected from a plurality of predetermined reference voltage ranges, and the voltage range of the audio signal within the predetermined time period is included within the target reference voltage range; and a power supply sub-circuit for generating a power supply voltage that matches the output power of the audio power amplifier based on the target reference voltage range, so as to supply power to the audio power amplifier.

* * * * *